United States Patent
Hsu et al.

(10) Patent No.: US 9,349,728 B1
(45) Date of Patent: May 24, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chia-Fu Hsu, Tainan (TW); Bo-Rong Chen, Hsinchu County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/670,428

(22) Filed: Mar. 27, 2015

(51) Int. Cl.
*H01L 23/535* (2006.01)
*H01L 27/088* (2006.01)
*H01L 21/8258* (2006.01)
*H01L 29/786* (2006.01)

(52) U.S. Cl.
CPC .......... *H01L 27/088* (2013.01); *H01L 21/8258* (2013.01); *H01L 23/535* (2013.01); *H01L 29/7869* (2013.01); *H01L 29/78696* (2013.01)

(58) Field of Classification Search
CPC . H01L 23/528; H01L 23/535; H01L 23/5226; H01L 27/088; H01L 27/124; H01L 27/11521; H01L 29/7813; H01L 29/7827; H01L 29/66734
See application file for complete search history.

(56) References Cited

U.S. PATENT DOCUMENTS

| | | | |
|---|---|---|---|
| 5,770,482 A * | 6/1998 | Kadosh | H01L 21/8221 257/E21.575 |
| 8,582,349 B2 | 11/2013 | Yamazaki et al. | |
| 2012/0286270 A1 | 11/2012 | Isobe et al. | |
| 2015/0021603 A1 | 1/2015 | Isobe et al. | |

* cited by examiner

*Primary Examiner* — Kyoung Lee
(74) *Attorney, Agent, or Firm* — Winston Hsu; Scott Margo

(57) ABSTRACT

A method for fabricating semiconductor device is disclosed. The method includes the steps of: providing a substrate having a metal-oxide semiconductor (MOS) transistor thereon and a first interlayer dielectric (ILD) layer surrounding the MOS transistor; forming a source layer, a drain layer, a first opening between the source layer and the drain layer, and a second ILD layer on the MOS transistor and the first ILD layer, wherein the top surfaces of the source layer, the drain layer, and the second ILD layer are coplanar; forming a channel layer on the second ILD layer, the source layer, and the drain layer and into the first opening; and performing a first planarizing process to remove part of the channel layer so that the top surface of the channel layer is even with the top surfaces of the source layer and the drain layer.

11 Claims, 4 Drawing Sheets

US 9,349,728 B1

SEMICONDUCTOR DEVICE AND METHOD FOR FABRICATING THE SAME

BACKGROUND OF THE INVENTION

1. Field of the Invention

The invention relates to a semiconductor device, and more particularly, to an oxide semiconductor transistor with a U-shaped channel layer.

2. Description of the Prior Art

Attention has been focused on a technique for formation of a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor, and within which, oxide semiconductor containing indium (In), gallium (Ga), and zinc (Zn) has been attracting attention.

A transistor including an oxide semiconductor film is known to have an extremely low leakage current in an off state. Nevertheless, current architecture of integrating transistor having oxide semiconductor film with metal-oxide semiconductor (MOS) transistor is still insufficient in bringing out optical performance of the device. Hence, how to improve the current fabrication flow for integrating oxide semiconductor transistor with MOS transistor has become an important task in this field.

SUMMARY OF THE INVENTION

According to a preferred embodiment of the present invention, a method for fabricating semiconductor device is disclosed. The method includes the steps of: providing a substrate having a metal-oxide semiconductor (MOS) transistor thereon and a first interlayer dielectric (ILD) layer surrounding the MOS transistor; forming a source layer, a drain layer, a first opening between the source layer and the drain layer, and a second ILD layer on the MOS transistor and the first ILD layer, wherein the top surfaces of the source layer, the drain layer, and the second ILD layer are coplanar; forming a channel layer on the second ILD layer, the source layer, and the drain layer and into the first opening; and performing a first planarizing process to remove part of the channel layer so that the top surface of the channel layer is even with the top surfaces of the source layer and the drain layer.

According to another aspect of the present invention, a semiconductor device is disclosed. The semiconductor device includes: a substrate having a metal-oxide semiconductor (MOS) transistor thereon and a first interlayer dielectric (ILD) layer surrounding the MOS transistor; a second ILD layer on the MOS transistor and the first ILD layer; a U-shaped channel layer in the second ILD layer; and a source layer and a drain layer adjacent to two sides of the channel layer, wherein the tips of the U-shaped channel layer and the top surfaces of the source layer, the drain layer, and the second ILD layer are coplanar.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
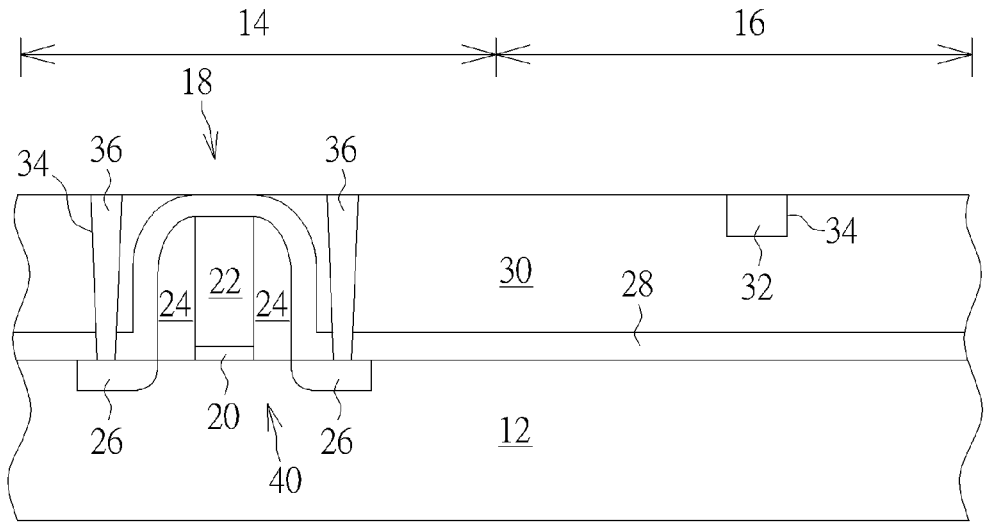
FIGS. 1-7 illustrate a method for fabricating semiconductor device according to a preferred embodiment of the present invention.

Referring to FIGS. 1-7, FIGS. 1-7 illustrate a method for fabricating semiconductor device according to a preferred embodiment of the present invention. As shown in FIG. 1, a substrate 12 is first provided, in which the substrate 12 could be a semiconductor substrate including silicon substrate, epitaxial substrate, silicon carbide substrate, or silicon-on-insulator (SOI) substrate, but not limited thereto. Preferably, a first region 14 and a second region 16 are defined on the substrate 12, in which the first region 14 is used for fabricating a metal-oxide semiconductor (MOS) transistor while the second region 16 is used for forming an oxide-semiconductor (OS) transistor or thin film transistor (TFT) thereafter.

At least one gate structure 18 is then formed on the substrate 12, and a plurality of doped wells (not shown) and/or shallow trench isolations (STIs) (not shown) could be formed in the substrate 12. Also, it should be noted that even though the fabrication process of this embodiment pertains to a planar type transistor, the fabrication process could also be applied to non-planar transistor such as FinFET, and in such instance, the element 12 shown in FIG. 1 would then become a fin-shaped structure on a substrate.

The fabrication of the gate structures 18 could be accomplished by a gate first process, a high-k first approach from gate last process, or a high-k last approach from gate last process. Since this embodiment pertains to agate first approach, agate insulating layer, a gate material layer, and a selective hard mask could be formed on the substrate 12, and a pattern transfer process is conducted by using a patterned resist (not shown) as mask to remove part of the hard mask, part of the gate material layer, and part of the gate insulating layer through single or multiple etching processes to form gate structure 18 composed of gate insulating layer 20 and gate electrode 22. The patterned resist is then stripped thereafter.

Next, a spacer 24 is formed on the sidewall of the gate structure 18, a source/drain region 26 and/or epitaxial layer (not shown) is formed in the fin-shaped structure and/or substrate 12 adjacent to two sides of the spacer 24, and a silicide layer (not shown) is selectively formed on the source/drain region 26 and/or epitaxial layer to form a MOS transistor 40. A contact etch stop layer (CESL) is then formed on the MOS transistor 40, and an interlayer dielectric (ILD) layer 30 composed of tetraethyl orthosilicate (TEOS) is formed on the CESL 28.

Next, a planarizing process such as chemical mechanical polishing (CMP) process is conducted to remove part of the ILD layer 30 and CESL 28, and another gate structure 32 is formed in the ILD layer 30. The formation of the gate structure 32 could be accomplished by first depositing a passivation layer (not shown) on the ILD layer 30 and then performing an etching process to remove part of the passivation layer for forming a plurality of openings (not shown), in which the openings on the first region 14 expose the ILD layer 30 while the opening on the second region 16 exposes the ILD layer 30. Next, an etching process is conducted to remove part of the ILD layer 30 on second region 16 for forming an opening 34 in the ILD layer 30, and another etching process is carried out thereafter to remove part of ILD layer 30 and CESL 28 on first region 14 for forming openings 34 exposing the source/drain region 26 of the MOS transistor 40. After removing the passivation layer completely, conductive materials are deposited into the openings 34 on both first region 14 and second region 16 to form a plurality of contact plugs 36 on the first region 14 and a gate structure 32 embedded in the ILD layer 30 of the second region 16.

According to an embodiment of the present invention, the formation of the contact plugs 36 and gate structure 32 could be accomplished by sequentially depositing a barrier/adhesive layer (not shown), a seed layer (not shown), and a conductive layer (not shown) into and filling the openings 34, in which the barrier/adhesive layer is conformally deposited into the openings 34 while the conductive layer is filled into the openings 34 entirely. The barrier/adhesive layer may be consisted of tantalum (Ta), titanium (Ti), titanium nitride (TiN) or tantalum nitride (TaN), tungsten nitride (WN) or a suitable combination of metal layers such as Ti/TiN, but is not limited thereto. A material of the seed layer is preferably the same as a material of the conductive layer, and a material of the conductive layer may include a variety of low-resistance metal materials, such as aluminum (Al), titanium (Ti), tantalum (Ta), tungsten (W), niobium (Nb), molybdenum (Mo), copper (Cu) or the likes, preferably tungsten or copper, and most preferably tungsten. Next, a planarizing process such as CMP process and/or etching process is conducted to remove part of the barrier/adhesive layer, seed layer, and conductive layer so that the top surface of the remaining conductive layer is even with the top surface of the ILD layer 30. This forms contact plugs 36 electrically connecting to the source/drain region 26 on first region 14 and a gate structure 32 embedded in the ILD layer 30 of the second region 16.

Next, a gate insulating layer 38 is formed on the MOS transistor 40 and the ILD layer 30, and a source layer 42, a drain layer 44, a channel layer 46 between the source layer 42 and the drain layer 46, and another ILD layer 48 are formed on the gate insulating layer 38, in which the top surfaces of the source layer 42, drain layer 44, channel layer 46, and ILD layer 48 are coplanar.

Figure 2:
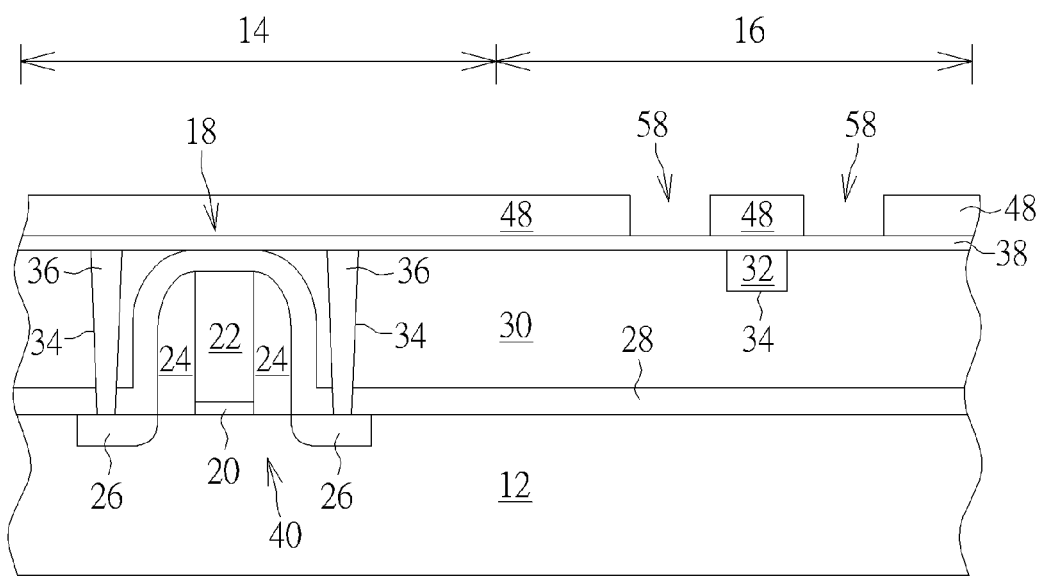

According to an embodiment of the present invention, as shown in FIG. 2, the formation of the ILD layer 48, source layer 42, drain layer 44, and channel layer 46 could be accomplished by first forming an ILD layer 48 on the gate insulating layer 38, performing an etching process to remove part of the ILD layer 48 to form two openings 58 adjacent to two sides of the gate structure 32 exposing the gate insulating 38 underneath. It should be noted that the width of the ILD layer 48 directly above the gate structure 32 is preferably controlled to be greater than the width of the gate structure 32.

Figure 3:
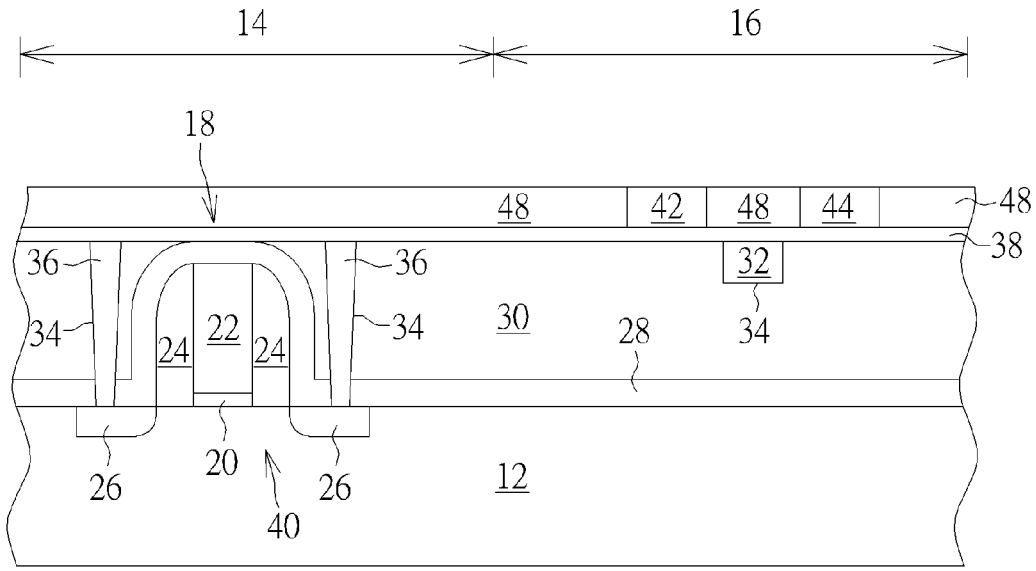

Next, as shown in FIG. 3, a conductive layer (not shown) is formed on the ILD layer 48 and into the two openings 58, and planarizing the conductive layer by using CMP process to form the source layer 42 and drain layer 44 within ILD layer 48.

Figure 4:
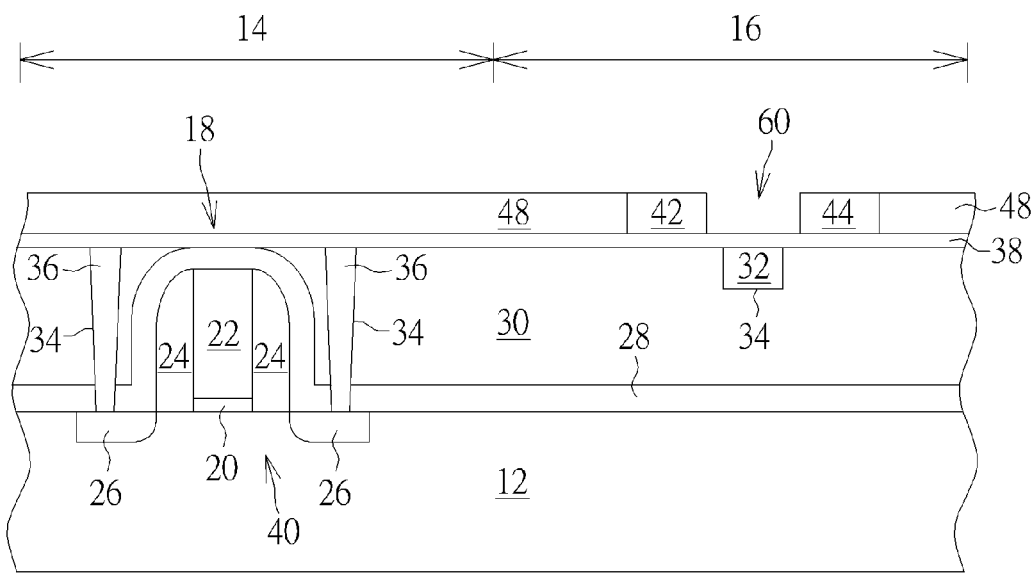

After source layer 42 and drain layer 44 are formed, as shown in FIG. 4, another etching is carried out to remove part of the ILD layer 48 between the source layer 42 and drain layer 44 for forming another opening 60 exposing the gate insulating layer 38. It should be noted that instead of controlling the width of ILD layer 48 directly above the gate structure 32 to be greater than the width of the gate structure 32 as shown in FIG. 2, it would also be desirable to first maintain the width of ILD layer 48 directly above the gate structure 32 to be the same as the width of gate structure 32 as shown in FIG. 2, and then control the width of the opening 60 in FIG. 4 during the etching process to be greater than the width of the gate structure 32, which is also within the scope of the present invention.

Figure 5:
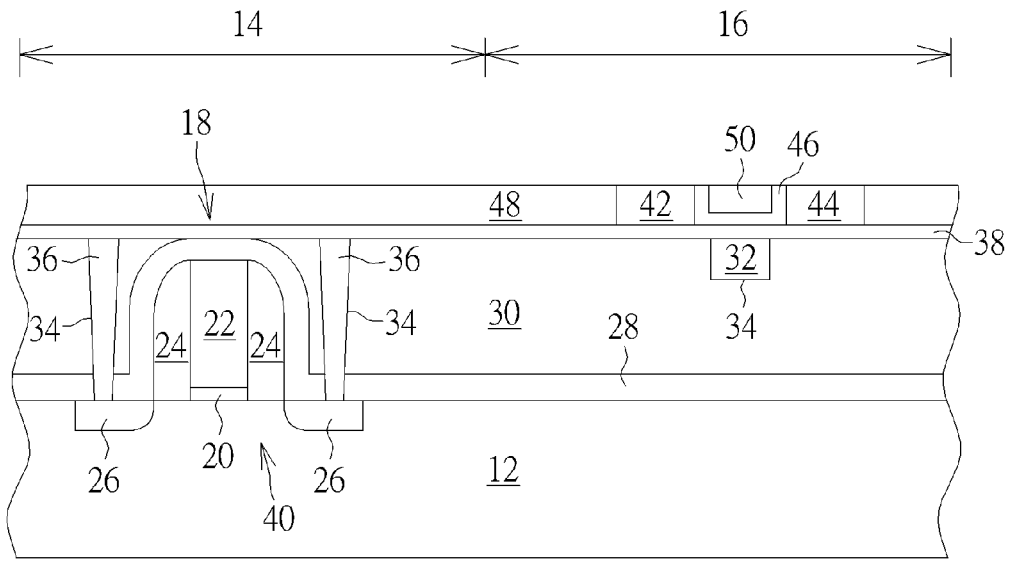

Next, as shown in FIG. 5, an oxide semiconductor (OS) layer or channel layer 46 and a protective layer 50 are sequentially deposited on the ILD layer 48, the source layer 42, the drain layer 44, and into the opening 60, and another planarizing process such as CMP is conducted to remove part of the protective layer 50 and part of the channel layer 46 so that the top surfaces of the remaining protective layer 50 and channel layer 46 are even with the top surfaces of the source layer 42, drain layer 44, and ILD layer 48. Preferably, the channel layer 46 between the source layer 42 and the drain layer 44 after the planarizing process reveals a U-shaped cross-sectional profile, in which the tips of the channel layer 46 and the top surfaces of the protective layer 50, source layer 42, drain layer 44, and ILD layer 48 are even to each other.

In this embodiment, the OS layer or channel layer 46 is preferably selected from the group consisting of indium gallium zinc oxide (IGZO), indium aluminum zinc oxide, indium tin zinc oxide, indium aluminum gallium zinc oxide, indium tin aluminum zinc oxide, indium tin hafnium zinc oxide, and indium hafnium aluminum zinc oxide, and the protective layer 50 could be selected from dielectric material consisting of silicon oxide, silicon nitride, SiON, and SiCN, but not limited thereto.

As a material for the source layer 42 and drain layer 44, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, and thorium may be used. Aluminum combined with one or more of elements selected from titanium, tantalum, tungsten, molybdenum, chromium, neodymium, and scandium may be used. The source layer 42 and drain layer 44 can have a single-layer structure or a layered structure including two or more layers. For example, the source layer 42 and drain layer 44 can have a single-layer structure of an aluminum film containing silicon, a two-layer structure in which a titanium film is stacked over an aluminum film, or a three-layer structure in which a titanium film, an aluminum film, and a titanium film are stacked in that order. It should be noted that if multi-layer design were chosen to form the source layer 42 and drain layer 44, the formation of the source layer 42 and drain layer 44 could be accomplished by using the same approach disclosed above and by doing so, the material layers within the resulting source layer 42 and drain layer 44 would reveal a U-shaped cross-section except the most top layer.

According to another embodiment of the present invention, instead of removing part of ILD layer 48 to form openings 58 and depositing conductive material into the openings 58 to form source layer 42 and drain layer 44 directly, it would also be desirable to first form the ILD layer 48 on gate insulating layer 38, remove part of the ILD layer 48 to form a patterned conductive layer within the ILD layer 48, pattern the patterned conductive layer through photo-etching process to form the source layer 42 and drain layer 44, and then form the channel layer 46 and protective layer 50 between the source layer 42 and drain layer 44, which is also within the scope of the present invention.

In alternative to the aforementioned approach of forming the ILD layer 48, forming the source layer 42 and drain layer 44, and then forming the channel layer 46 and protective layer 50 therebetween, it would also be desirable to form the channel layer 46 and protective layer 50 before forming the source layer 42 and drain layer 44 depending on the demand of the process, which is also within the scope of the present invention.

Moreover, according to another embodiment of the present invention, it would also be desirable to first form a conductive layer on the gate insulating layer 38 entirely and pattern the conductive layer through photo-etching process to form the source layer 42 and drain layer 44 on the gate insulating layer 38. Next, the ILD layer 48 is deposited on the gate insulating layer 38, source layer 42 and drain layer 44, and between the source layer 42 and drain layer 44 with a planarizing process or etching back conducted thereafter so that the top surfaces of the ILD layer 48 and source layer 42 and drain layer 44 are coplanar. After removing the ILD layer 48 between the source layer 42 and drain layer 44, channel layer 46 is deposited into the opening between the source layer 42 and drain layer 44 with a planarizing process or etching back process performed thereafter.

Figure 6:
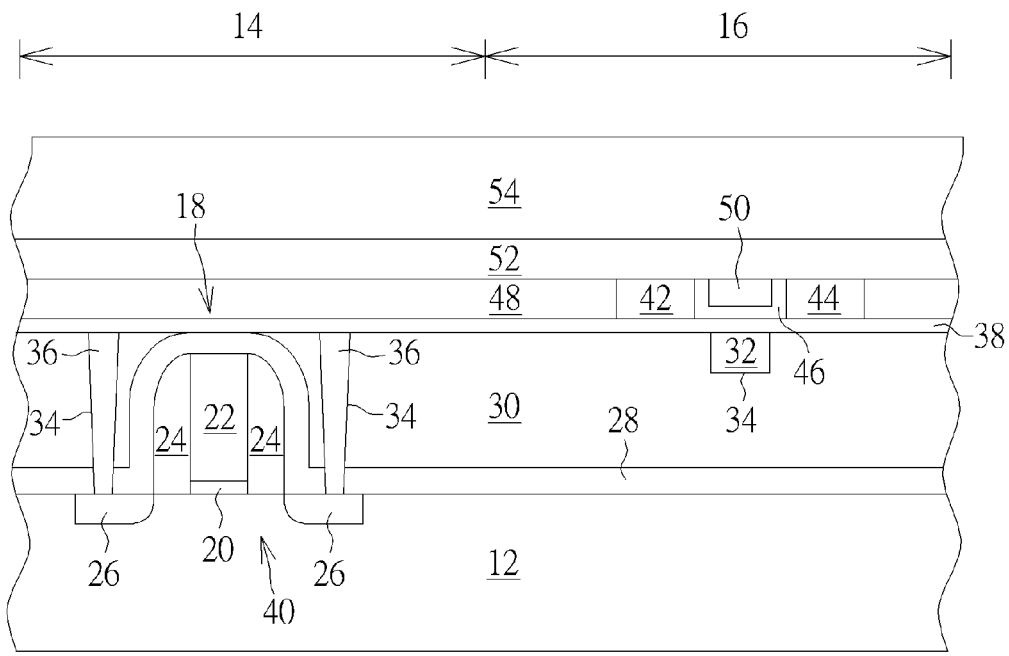

After the source layer 42, channel layer 46, and drain layer 44 are formed, as shown in FIG. 6, a passivation layer 52 is deposited on the ILD layer 48, source layer 42, channel layer 46, and drain layer 44, and another ILD layer 54 is formed on the passivation layer 52.

Figure 7:
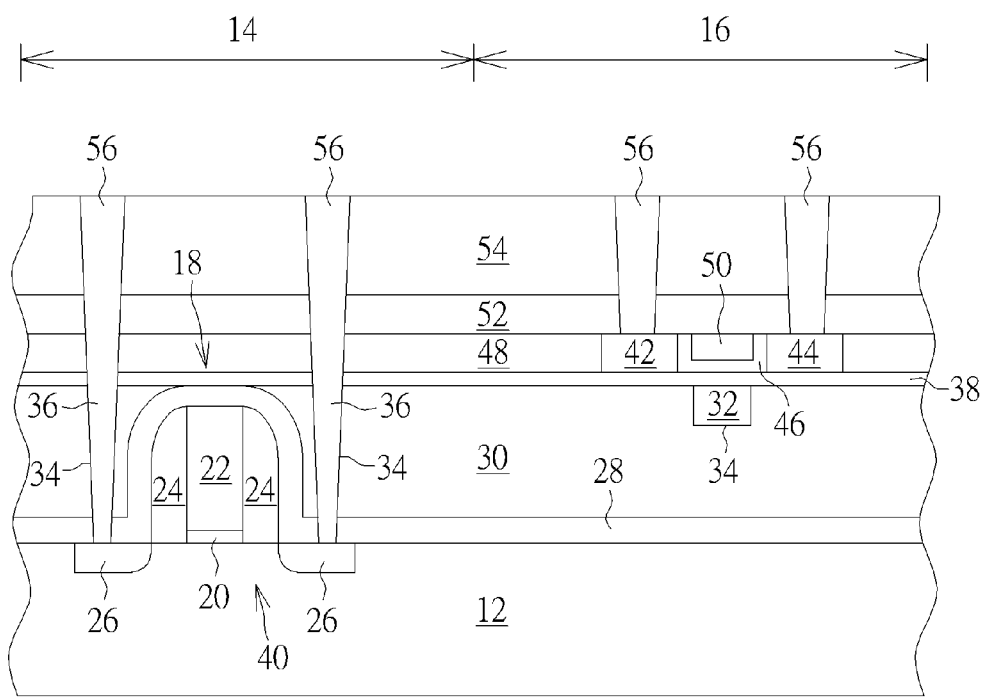

Next, as shown in FIG. 7, and a plurality of contact plugs 56 are formed on both first region 14 and second region 16 for electrically connecting contact plugs 36 formed previously on first region 14 and the source layer 42 and drain layer 44 on second region 16. The formation of contact plugs 56 could be accomplished by following steps used for forming aforementioned contact plugs 36 and the details of which are not explained herein for the sake of brevity. This completes the fabrication of a semiconductor device according to a preferred embodiment of the present invention.

Referring again to FIG. 7, which further illustrates a structural view of a semiconductor device according to a preferred embodiment of the present invention. As shown in FIG. 7, the semiconductor device preferably includes a MOS transistor 40 disposed on first region 14 of the substrate 12, an ILD layer 30 surrounding the MOS transistor 40, another ILD layer 48 disposed on the MOS transistor 40 and the ILD layer 30, and an oxide-semiconductor (OS) transistor disposed on the second region 16. The OS transistor preferably includes a U-shaped channel layer 46 embedded in the ILD layer 48, a protective layer 50 disposed on top of the U-shaped channel layer 46, a gate structure 32 embedded in the ILD layer 30 and directly under the U-shaped channel layer 46, and a source layer 42 and drain layer 44 disposed in the ILD layer 48 and adjacent to two sides of the U-shaped channel layer 46. Preferably, the top surface of the protective layer 50, the tips of the U-shaped channel layer 46, and the top surfaces of the source layer 42, the drain layer 44, and the ILD layer 48 are coplanar. In addition, the width of the gate structure 32 is preferably less than the width of the U-shaped channel layer 46, or more specifically, the width of the gate structure 32 is less than the width of the horizontal portion of U-shaped channel layer 46.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a metal-oxide semiconductor (MOS) transistor thereon and a first interlayer dielectric (ILD) layer surrounding the MOS transistor;
   forming a source layer, a drain layer, a first opening between the source layer and the drain layer, and a second ILD layer on the MOS transistor and the first ILD layer, wherein the top surfaces of the source layer, the drain layer, and the second ILD layer are coplanar;
   forming a channel layer on the second ILD layer, the source layer, and the drain layer and into the first opening; and
   performing a first planarizing process to remove part of the channel layer so that the top surface of the channel layer is even with the top surfaces of the source layer and the drain layer.

2. The method of claim 1, further comprising:
   forming a gate structure in the first ILD layer;
   forming the second ILD layer on the gate structure and the first ILD layer;
   forming the source layer and the drain layer in the second ILD layer and adjacent to two sides of the gate structure; and
   forming the channel layer on the gate structure.

3. The method of claim 1, further comprising:
   forming the channel layer and a protective layer on the second ILD layer, the source layer and the drain layer and into the first opening;
   performing the first planarizing process on the protective layer and the channel layer so that the top surfaces of the protective layer and the channel layer are even with the top surfaces of the source layer and the drain layer.

4. The method of claim 1, further comprising:
   forming a passivation layer on the second ILD layer, the source layer, the channel layer, and the drain layer;
   forming a third ILD layer on the passivation layer; and
   forming a plurality of contact plugs in the third ILD layer and the passivation layer for electrically connecting to the source layer and the drain layer.

5. The method of claim 1, further comprising:
   removing part of the second ILD layer to form a plurality of second openings;
   forming the source layer and the drain layer into the second openings;
   performing a second planarizing process to remove part of the source layer and part of the drain layer so that the top surfaces of the source layer and the drain layer are even with the top surface of the second ILD layer; and
   removing part of the second ILD layer to form the first opening.

6. The method of claim 1, further comprising forming a gate insulating layer on the first ILD layer and the MOS transistor before forming the second ILD layer.

7. A semiconductor device, comprising:
   a substrate having a metal-oxide semiconductor (MOS) transistor thereon and a first interlayer dielectric (ILD) layer surrounding the MOS transistor;
   a second ILD layer on the MOS transistor and the first ILD layer;
   a U-shaped channel layer in the second ILD layer; and
   a source layer and a drain layer adjacent to two sides of the U-shaped channel layer, wherein the tips of the U-shaped channel layer and the top surfaces of the source layer, the drain layer, and the second ILD layer are coplanar.

8. The semiconductor device of claim 7, further comprising a protective layer on the U-shaped channel layer.

9. The semiconductor device of claim 8, wherein the top surface of the protective layer, the tips of the U-shaped channel layer, and the top surfaces of the source layer, the drain layer, and the second ILD layer are coplanar.

10. The semiconductor device of claim 7, further comprising a second gate structure in the first ILD layer and directly under the U-shaped channel layer.

11. The semiconductor device of claim 10, wherein the width of the second gate structure is less than the width of the U-shaped channel layer.

\* \* \* \* \*